(12) United States Patent
Fregona et al.

(10) Patent No.: US 11,378,587 B2
(45) Date of Patent: Jul. 5, 2022

(54) ELECTRICAL RAIL MOUNT DEVICE AND COVER FOR AN ELECTRICAL RATL MOUNT DEVICE

(71) Applicant: CARLO GAVAZZI SERVICES AG, Steinhausen (CH)

(72) Inventors: Denis Fregona, Santa Giustina (IT); Claudio Balcon, Belluno (IT)

(73) Assignee: Carlo Gavazzi Services AG, Steinhausen (CH)

( * ) Notice: Subject to any disclaimer, the term of this patent is extended or adjusted under 35 U.S.C. 154(b) by 7 days.

(21) Appl. No.: 16/898,654

(22) Filed: Jun. 11, 2020

(65) Prior Publication Data
US 2020/0393493 A1     Dec. 17, 2020

(30) Foreign Application Priority Data
Jun. 12, 2019 (EP) .................... 19179595

(51) Int. Cl.
*G01R 1/04* (2006.01)
*G01R 21/133* (2006.01)
*H01R 9/24* (2006.01)

(52) U.S. Cl.
CPC ......... *G01R 1/0416* (2013.01); *G01R 21/133* (2013.01); *H01R 9/2416* (2013.01); *H01R 9/2425* (2013.01)

(58) Field of Classification Search
CPC .. G01R 1/0416; G01R 21/133; G01R 22/063; G01R 22/065; G01R 22/066; G01R 22/061; H01R 9/2416; H01R 9/2425
See application file for complete search history.

(56) References Cited

U.S. PATENT DOCUMENTS 4,491,791 A    1/1985  Balch
6,687,627 B1 * 2/2004  Gunn ................... G01R 21/133
                                                          324/500
(Continued)

FOREIGN PATENT DOCUMENTS

CN     201489033 U    5/2010
CN     205157617 U    4/2016
(Continued)

OTHER PUBLICATIONS

Examination Report re AU App. No. 2020203718 dated Jul. 23, 2020.
(Continued)

*Primary Examiner* — Akm Zakaria
(74) *Attorney, Agent, or Firm* — Brooks Kushman P.C.

(57) ABSTRACT

A cover for an electrical rail mount device is provided. Further, an electrical rail mount device for mounting on a rail is provided, comprising at least ono input terminal configured to receive an input line, fixing means configured to fix the input line to the input terminal to establish an electrical connection, a lockable cover reversibly movable from an open state into a closed state, whereas the cover is configured to cover the fixing means in the closed state, such that the fixing means can only be accessed by moving the cover from the closed state into the open state, an electrical element arranged in the cover and configured to provide an electrical function to an active electronic element of the electrical rail mount device, wherein an electrical connection is provided between the electrical element and the active electronic element.

13 Claims, 6 Drawing Sheets

(56) References Cited

U.S. PATENT DOCUMENTS

| | | | | |
|---|---|---|---|---|
| 7,478,003 B2* | 1/2009 | Cowan | ............... | G01R 22/065 |
| | | | | 702/117 |
| 7,800,890 B1 | 9/2010 | Therrien et al. | | |
| 2002/0084914 A1* | 7/2002 | Jackson | ............. | G01R 22/065 |
| | | | | 340/870.02 |
| 2005/0270016 A1 | 12/2005 | Karanam et al. | | |
| 2008/0284614 A1* | 11/2008 | Perez | ................. | G01R 22/065 |
| | | | | 340/870.02 |

FOREIGN PATENT DOCUMENTS

| | | |
|---|---|---|
| CN | 208752121 U | 4/2019 |
| DE | 102010032038 A1 | 1/2012 |
| DE | 102010032038 A8 | 4/2012 |
| EP | 2253962 A1 | 11/2010 |
| EP | 3054754 A1 | 8/2016 |
| EP | 3057387 A1 | 8/2016 |
| EP | 2901166 B1 | 8/2018 |
| KR | 20030078540 A | 10/2003 |
| WO | 2014051619 A1 | 4/2014 |

OTHER PUBLICATIONS

Extended Search Report dated Nov. 22, 2019.
Examination Report re App. No. AU2020203718 dated Jan. 19, 2021.
Examination Report re App. No. CA 3,081,463 dated Jun. 16, 2021.

* cited by examiner

ELECTRICAL RAIL MOUNT DEVICE AND COVER FOR AN ELECTRICAL RATL MOUNT DEVICE

CROSS-REFERENCE TO RELATED APPLICATION

This application claims priority to European Application Serial No. 19179595.4, filed on Jun. 12, 2019, the disclosure of which is hereby incorporated in its entirety by reference herein.

TECHNICAL FIELD

The invention relates to technical field of electrical rail mount devices, such as e.g. electricity meters, and to a cover for an electrical rail mount device.

BACKGROUND

Electrical rail mount devices are devices that may e.g. be used inside of industrial or electrical equipment racks. The rail on which the electrical rail mount devices are mounted may e.g. be a so-called DIN rail, or TOP hat rail according to IEC/EN 60715. Although describes mostly in regard to electricity meters, it is understood, that the present invention may be applied to any electrical rail mount device.

Electricity meters are modern measurement devices to determine power consumption of private and commercial applications in any field of use. In a basic version such electric meters do just measure power consumption not in analogue way but in digital way. Predetermined parameters with regard to power consumption, like e.g. time dependency of power consumption, amounts, peaks, etc., are monitored and stored. This data can then read out when required by persons entitled to read out and/or adjust the electricity meter.

In a more developed version of an electricity meter the electricity meter additionally comprises a smart meter gateway. Such smart meter gateway comprises at least a communication unit for the electricity meter, e.g. for receiving measurement data of the electricity meter, storing and read out purposes. Typically, the smart gateway meter is also enabled beyond such basic functions and can have a plurality of other functionalities, e.g. communication with different controllable loads or energy generators, with an electricity meter administrator, with electricity network providers, energy market participants and others. Typically, the electricity meter can also be remote controlled via the smart meter gateway whereas certain control commands are provided from an external data source connected to the smart meter gateway. Often the smart meter is also able to have a secure communication with such external sources utilized by the smart meter gateway. In context of this specification a smart meter gateway shall be considered a communication unit, which at least collects and/or stores measurement values of the electricity meter with regard to energy consumption.

In operation status of an electricity meter the electricity meter is connected to at least one power line, typically a plurality power lines, which respectively are fixed in the respective power terminals to measure the power consumption of a load connected directly or indirectly to the electricity meter. As the consumption of power is typically related to costs and the electricity meter is typically operated at sites where the consumption of energy takes place, the fixing means of the power lines are locked with one or more seals to avoid manipulation at the electricity meter and e.g. to bypass the electricity meter to save costs.

In case the electricity meter also comprises a smart meter gateway the communication to the smart meter gateway will run via a separate terminal and not via the power terminals. This one or more separate non-power terminal/s connected to the smart meter gateway are called auxiliary port/s herein. These terminals can have different functions. A basic function is a communication function, so the electricity meter can be read out from a place remote from the location of the electricity meter, e.g. a center of an electricity network operator. Other functions are e.g. providing digital input via such auxiliary port to control the electricity meter or to provide a low voltage output signal. Other functionalities are possible and shall in no way restricted with regard to this patent application.

Such electricity meters are known in the prior art by products on the market, e.g. by the energy meter powerlogic METSEPM5111. This device comprises a number of power terminals, respectively current terminals, which in operation are covered by a cover which is sealed. In addition, this electricity meter comprises auxiliary ports for bus communication, voltage outputs etc., which are accessible if the cover of the power terminal is in a closed state. However, the auxiliary ports are positioned widely distributed on the backside surface of the electricity meter.

It is an object of the invention to provide a compact and structured electricity meter and a suitable cover for such electricity meter.

SUMMARY

The above stated problem is solved by the features of the independent claims.

Accordingly, the present invention provides an electrical rail mount device for mounting on a rail, e.g. DIN rail, or TOP hat rail according to IEC/EN 60715. The electrical rail mount device comprises at least one input terminal configured to receive an input line, fixing means configured to fix the input line to the input terminal to establish an electrical connection, a lockable cover reversibly movable from an open state into a closed state, whereas the cover is configured to cover the fixing means in the closed state, such that the fixing means can only be accessed by moving the cover from the closed state into the open state, an electrical element arranged in the cover and configured to provide an electrical function to an active electronic element of the electrical rail mount device, wherein an electrical connection is provided between the electrical element and the active electronic element.

The electrical rail mount device may e.g. comprise an electricity meter for measuring power consumption, and the at least one input terminal may be provided as a power terminal configured to receive a power line, and the fixing means may be configured to fix the power line to the power terminal to establish an electrical connection. The electrical element may be provided as an auxiliary port configured to receive an auxiliary line, whereas the auxiliary port may be configured to allow a communication of an external source with a smart meter gateway comprised by the electricity meter via the auxiliary line, the cover further comprising auxiliary fixing means for fixing the auxiliary line to the auxiliary port positioned such that they are accessible in the closed state of the cover.

The electrical rail mount device may also be any other type of rail mount device, e.g. power sources, switches, measurement devices or the like. Such electrical rail mount devices may comprise active electronic elements, like e.g. controllers to control the function of the respective electrical rail mount device.

The electrical element of the cover may with such electrical rail mount devices e.g. comprise passive electrical elements that allow contacting the active electronic element. Such passive electrical elements may e.g. comprise a connection terminal and electrical connections between the connection terminal and the active electronic element.

It is understood, that the electrical element of the cover may as alternative or in addition also comprise active components, like e.g. wired or wireless network controllers, processing elements, or the like. A wired network controller (e.g. with internal transceiver) may e.g. be coupled via a digital interface to the active electronic element of the electrical rail mount device and me be further coupled electrically to the connection terminal. The wireless network controller may e.g. be coupled to the active electronic element of the electrical rail mount device via a digital interface and may provide wireless network capabilities to the active electronic element.

The processing elements may e.g. provide additional processing capabilities, like e.g. digital signal processing functions or the like, to the active electronic element of the electrical rail mount device.

Further, there is provided a cover suitable to be installed at an electrical rail mount device to cover fixing means of the electrical rail mount device in a closed state, the cover comprising an electrical element configured to provide an electrical function to an active electronic element of the electrical rail mount device, wherein an electrical connection is provided between the electrical element and the active electronic element.

The cover may be suitable to be installed at an electrical rail mount device that comprises an electricity meter to cover fixing means that are configured to fix a power line to a power terminal of the electricity meter. The cover may comprise auxiliary ports and auxiliary fixing means configured to fix an auxiliary electrical line to the auxiliary port, whereas the auxiliary port may be configured to allow a communication of an external source with a smart meter gateway comprised by the electricity meter via the auxiliary electrical line, whereas the auxiliary port and the auxiliary fixing means are arranged such at the cover that they are accessible when the cover covers the fixing means for the power line. To avoid any doubt, the functional definition of the arrangement of the auxiliary port and the auxiliary fixing means do not lead to an inclusion of the fixing means or the power terminals to the cover. By providing such multifunctional cover a compact solution in the field of electricity meters is provided A power terminal is to be understood as power interface of the electricity meter for the source power line and for providing power to a load or a plurality of loads whose energy respectively power consumption shall be measured. This means that the power meter will comprise at least one power terminal for receiving a source power line that provides electrical power to the electricity meter, and another power terminal for providing the electrical power to the loads. With the fixing means the power lines are fixed in the power terminals to provide an electric connection between the respective power lines and the electricity meter. For this fixation of the power line to the power terminal screws, clips, or other fixing means can be utilized.

The cover covering the fixing means has the purpose to avoid that the fixing means for the at least one power terminal are unfixed by an unentitled person. The cover covers the fixing means in such way in closed state that the fixing means cannot be reached by such unentitled person. In addition, the cover can be locked and/or sealed in the closed state such that the cover cannot be moved from the closed state to the open state in case it is locked and/or sealed. With the seal it can at least be detected if the cover is moved from the closed state to the open state by an unentitled person. It is understood, that sealing and the locking may be provided by the same element.

However, an auxiliary port comprising convenient, but optional features for an electricity meter need not to be protected like the power terminal, as the auxiliary port does not provide power that should be measured. Optional features may e.g. comprise bus communications or the like. For this reason, the cover for the fixing means of the at least one power terminal should not cover the at least one auxiliary port, as otherwise the auxiliary port is not accessible during operation. However, such accessibility of the at least one auxiliary port would be advantageous during operation of the electricity meter. If the cover also protects the auxiliary port and a modification shall take place with regard to the auxiliary port, the sealed cover needs to be unsealed and after the modification of the auxiliary port needs to be sealed again. This may happen for example, if a wire is to be connected to the respective auxiliary port. Unsealing and sealing can however be avoided by the invention. Therefore, the at least one auxiliary port is not be covered by the cover in its closed state according to the invention.

By integrating the auxiliary port or a plurality of auxiliary ports into the cover for the fixing means of the at least one power terminal, a compact arrangement is provided. This arrangement also provides an additional function to the cover. As a consequence, the electricity meter can be designed much more compact. The cover is no longer only a protection with regard to the manipulation of the power terminal. Instead, it also comprises active components of the electricity meter in form of one or more auxiliary ports and corresponding wiring inside the cover. This provides a smart lockable cover for an electricity meter.

Preferably all auxiliary ports for the electricity meter are comprised by the cover. Therefore, space is generated compared to prior art meters with distributed arrangements and the electricity meter can be built even more compact. With this an efficient way is provided to allow access e.g. to a smart meter gateway in the smart meter via the accessible at least one auxiliary port. This allows remotely reading out or controlling the electricity meter, e.g. by network providers, the consuming customer or other entitled and interested entities of for other reasons. The term "external sources" refers to sources external to the electricity meter in a spatial way that can communicate with the smart meter gateway electronically, e.g. via a data lines, a bus or a network. The term smart meter gateway in this context is to be understood as any type of control unit or controller that may communicate with such an external source.

Such electricity meter can be used for all type of currents, e.g. direct current, alternating current, three phase currents, and the like. The number of power terminals and fixing means may be adapted accordingly.

Further embodiments of the present invention are subject of the further dependent claims and of the following description, referring to the drawings.

In a first embodiment of the invention, the cover may be removably attached to a non-cover part, especially to a housing, of the electricity meter. Removably attached means the cover can be installed or uninstalled without destruction of the attachment elements attaching the cover especially to the housing or another fix part of the electricity meter. This provides the possibility the substitute the cover in case an auxiliary port is broken or a different number of auxiliary ports, i.e. more or less auxiliary ports, are required. Another option is to substitute the cover comprising an auxiliary port by a cover not comprising any electrically active elements, especially auxiliary ports. This can be of interest, if the electricity meter shall be used only as digital measurement device however shall not be remotely controllable utilizing the smart meter gateway. In this way an electricity meter can be shipped to the customer that can be upgraded or downgraded by substituting a cover comprising no auxiliary ports by a cover comprising at least one auxiliary port, preferred a plurality of auxiliary ports, or vice versa.

In another embodiment of the electricity meter, the auxiliary port may be electrically connected to the smart meter gateway, whereas an interface may be present between the auxiliary port and the smart meter gateway, whereas the interface may connect an electrical contact connected with the auxiliary port with a contact connected to the smart meter gateway, whereas the interface further allows to reversibly electrically connect and disconnect the at least one auxiliary port with the smart meter gateway. Such interface can comprise contact pins located on the cover-side or openings for contact pins on the cover-side. The matching corresponding connection parts are located at the non-cover part of the electricity meter, e.g. the housing. This enables a controlled and easy installing and removal of the electrical connection from the auxiliary ports comprised by the cover to the electricity meter, especially to the smart meter gateway. Therefore, the connection and disconnection of the electric connection via the interface is a reversible process.

In a further embodiment, the cover may comprise a box-like shape. This allows a compact design of the cover. Additionally, the electrical active parts of the at least one auxiliary port can be arranged inside the volume defined by the box-like shaped cover. So the auxiliary ports are well protected, have a compact arrangement and can be easily removed due to the simple physical structure of the cover.

In another embodiment of the invention, the cover may comprise a plurality of auxiliary ports and corresponding auxiliary fixing means, especially two, three, four, five or more than five auxiliary ports and corresponding fixing means for the respective number of auxiliary ports. These auxiliary ports may preferably have different functionalities. Such functionalities may e.g. be defined by the capabilities of the comprised smart meter gateway. Therefore, a compact and flexible arrangement can be provided with a wide set of functionalities usable by communicating with or connected to the smart meter gateway. In addition, different covers with different numbers of auxiliary ports and different functionalities can be provided.

In a further embodiment of the electricity meter, the cover may comprise a first plane element and a second plane element, whereas the first plane element and the second plane element are perpendicular to each other and are connected at the edges of the first and second plane element, whereas the first plane element comprises inlets to receive an auxiliary connection in the auxiliary port and the second plane element comprises the auxiliary fixing means. The fixing means are preferably realized by one hole per auxiliary port and a corresponding screw for such hole, whereas the hole and the screw are made such that by inserting the screw into that hole a connection at the respective auxiliary port can be fixed and an electrical connection is established. In this configuration a rotational symmetry axis of the hole and a symmetry axis of the inlet of the auxiliary port are perpendicular to each other which allows efficient fastening of the connection. The term "inlet" may generally be understood as an opening in which a wire, cable or line is insertable to form an electrical connection or contact via an auxiliary port.

In an embodiment of the invention, the cover may be mounted pivotably to a non-cover part of the electricity meter, especially the housing, to move the cover reversibly from the open state to the closed state and vice versa. This is an easy and reliable way to move the cover from the open state to the closed state and from the closed state to the open state.

In a further embodiment, the pivotably mounted cover may be pivotable around a plurality of virtual axis, which are parallel to the first plane element and the second plane element, whereas the position of these plurality of axis is translationally moved during the movement of the cover from to open state to the closed state. The plurality of virtual axis may also be seen as a single axis that moves during the rotation of the cover. This provides the possibility to build the cover in compact way and to move it simply from an open state into a closed state and vice versa. This is especially advantageous, if the cover is of box-like shape and is positioned directly adjacent to the housing of the electricity meter.

In another embodiment of the invention, the electricity meter may comprise guiding means in form of a notch at the cover and a pivot that is attached to a non-cover part, especially the housing, engaging with the notch, whereas the pivot gears into the notch and the pivot is slidable in the notch, whereas the pivot and the notch are interacting such that they define the pathway of the cover when moved from the closed state to open state and vice versa. This is a technical easy way to provide a pivotable cover relative to the fix housing of the electricity meter. It is understood, that the mechanics may also be reversed and that the pivot may be arranged on the cover and the notch on the non-cover part.

In an embodiment, the notch may comprise a V-like shape comprising a first flank and a second flank, which are connected by a rounded tip whereas the notch is positioned in closed state such that first flank of the V is parallel to the first plane element and the tip of the notch points to the side arranged opposite to the second plane element. This is practically an easy way to perform a pivotable movement around the plurality of axis. In a preferred embodiment the first flank of the V-like notch is essentially parallel the surface of the cover element comprising the fixing means for the connections of the auxiliary ports and the second flank is essentially standing perpendicular at its ending part to the first plane element. The second flank comprises in this embodiment a curved middle part from the tip to the end part. Furthermore, in this embodiment, the tip of the notch is directed towards the center part of the electricity meter.

In a further embodiment, the cover may comprise a locking cover part to lock the cover in the closed state by interaction of the locking cover part with a locking counterpart arranged at the non-cover part, especially at the housing, of the electricity meter, whereas the locking cover part and the locking counterpart form together a locking mechanism. Such locking cover parts and locking counter parts can be arranged such that they form a pin-hole mechanism that can be locked. The locking mechanism is preferably designed such that the cover can only be opened and locked by authorized persons or such that it may be detected if the cover has been opened by an unauthorized person.

In another embodiment of the invention, the locking cover part may be lockable with the locking counterpart by a separate locking device. Such separate locking device can be a lock or seal, e.g. a seal with a wire and a lead seal. In such version the cover locking part and the cover counter locking part can be formed as interleaved half-ring-like structure. A locking pin, wire or filament can run through the opening in the interleaved half-ring-like structures in a way that the cover cannot be opened if such pin, filament or wire is present. In addition, the separate locking device can be used that is accessible, lockable and unlockable only by authorized personal. In this way, the separate locking device can be provided by the exclusive personal to lock the cover.

The electricity meter may comprise a first cover for an input power terminal and a second cover for an output power terminal, whereas the at least one auxiliary port may be comprised in only one of these covers. In a preferred embodiment only the input power terminal shall be covered with a cover comprising the at least one auxiliary port.

In another variant of the cover, the cover may be suitable to be installed at an electricity meter to cover fixing means for fixing a power line to a power terminal of an electricity meter, whereas the cover is movable from an open state to a closed state and vice versa, whereas the fixing means are only accessible if the cover is in the open state and are not accessible when the cover is in the closed state, whereas the cover comprises at least one auxiliary port and at least one corresponding auxiliary fixing means for fixing an electrical connection to the at least one auxiliary port, whereas the at least one auxiliary port and the corresponding fixing means are accessible in the closed state of the cover.

In a preferred embodiment the cover comprises a mechanism to reversibly mechanically install and uninstall the cover to and from an electricity meter and it further comprises an electrical interface, whereas the interface connects in the installed state an electrical contact connected with the auxiliary port with a contact connected to the electricity meter, especially the smart meter gateway, whereas the interface is formed such that it allows to reversibly electrically connect the auxiliary port to and disconnect the auxiliary port from the electricity meter, especially the smart meter gateway.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

In the figures like reference signs denote like elements unless stated otherwise.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
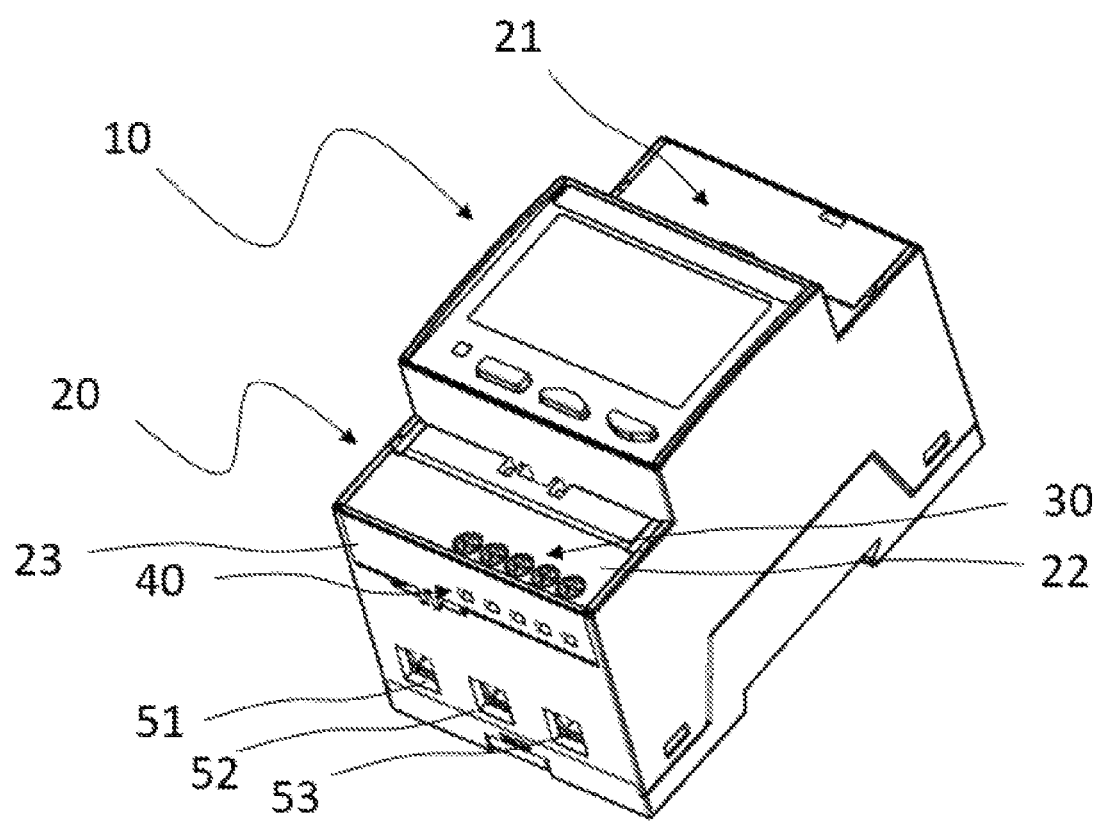
FIG. 1 shows a spatial view from an upper position of an embodiment of an electricity meter according to the present invention with a cover in a closed state.

FIG. 1 shows an electricity meter 10. A display with input and control means are schematically comprised in the center part of the electricity meter, which however are of no relevance for the invention. For this reason, no references signs have been attributed to these parts.

The electricity meter 10 comprises two covers 20 and 21. The cover 20 covers three exemplary fixing means 61, 62 and 63 (see FIG. 2) for fixing power lines to respective input power terminal, in case of this example three input power terminals 51, 52 and 53. Three power lines (not shown) can be connected to the input terminals 51, 52, 53, one power line per input power terminal 51, 52, 53. The cover 21 covers the fixing means for the output power terminals of the electricity meter 10 and is essentially flap-like formed. It is understood, that although the locking and sealing mechanism is mainly described in conjunction with the cover 20 below, the cover 21 may be embodied in analogy to cover 20. The below explanations regarding cover 20 may therefore also be applied to cover 21.

For sake of clarity, one power terminal is enough to practice the invention. The invention would also work for two, four, five or more than five power terminals. The number of terminals can be chosen suitable for the respective application of the electricity meter.

In the closed state of the cover 20 and 21 cover the fixing means formed by respective holes and screws with which a power line can be fixed in the respective power terminals 51, 52, 53. The first cover 20 is shaped box-like and has basically a rectangular cross-section.

The first cover 20 comprises a first plane element 22, which is essentially flat defining a first plane and a second plane element 23, which is also essentially flat defining a second plane. These planes are essentially perpendicular to each other and meet or connect to each other at respective long side edges. Not shown are the counterparts to the first plane element 22 and the second plane element 23, which are provided to form the box-like shape of the first cover 20.

In FIG. 1 the first plane element 22 comprises openings that allow access to the auxiliary fixing means 30, in this embodiment screws, to fix a respective auxiliary line or wire to the auxiliary ports 40. Also other auxiliary fixing means than holes and screws can be utilized, like e.g. clamps, clips or the like. The openings of the auxiliary ports 40 are comprised by the second plane element 23 of the cover 20. The auxiliary ports 40 are able to receive wires or lines to establish connections to utilize the auxiliary port functions, which are typically controlled via the electricity meter circuit board and smart meter gateway (both not shown).

Figure 2:
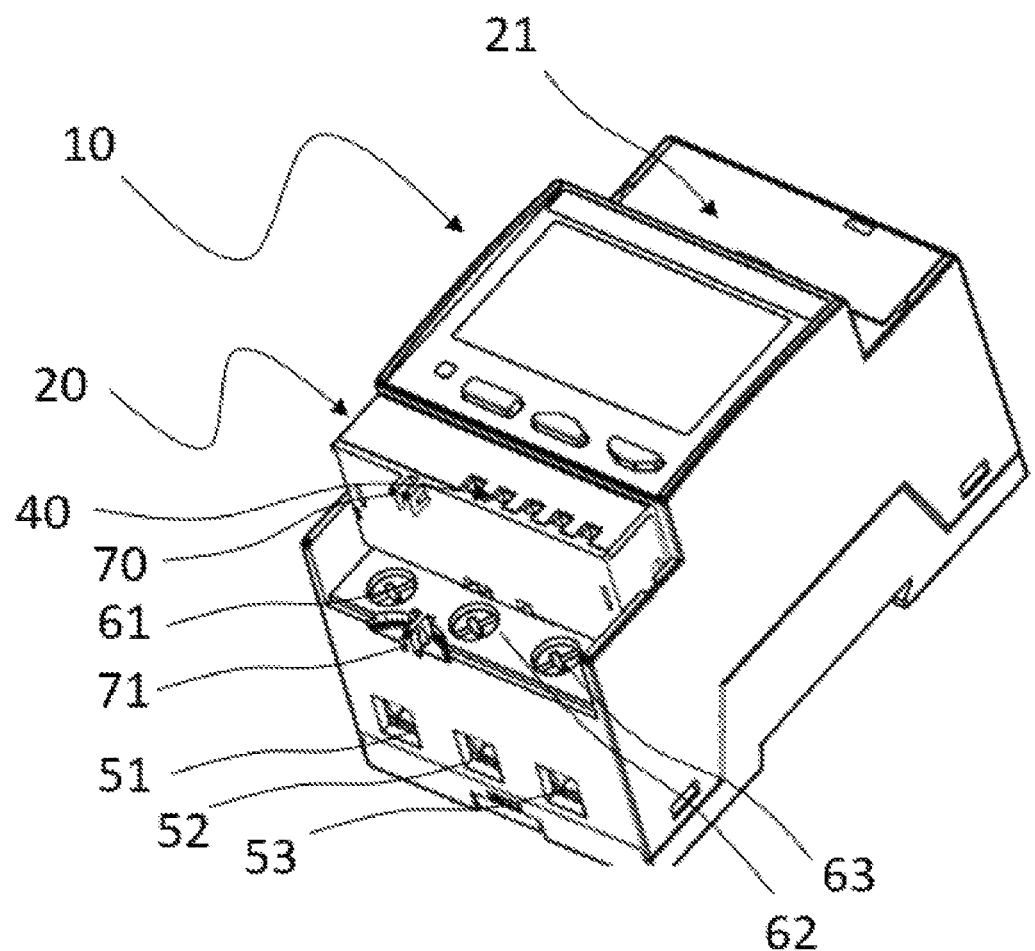
FIG. 2 shows a spatial view from an upper position of an embodiment of an electricity meter according to the present invention with a cover in an open state.

FIG. 2 shows the electricity meter of FIG. 1, whereas the cover 20 has been moved from the closed state to an open state. The second plane element 23 of the cover 20 now points to the upward direction and the first plane element 22 is no longer visible as it is positioned directly adjacent to the respective part of the housing of the electricity meter 10. In the open state of cover 20 the fixing means 61, 62 and 63 are visible, with which power lines can be fixed to the input power terminals 51, 52 and 53.

In addition, a cover locking part 70 is shown. The cover locking part 70 is positioned at the bottom part of the box-like shaped cover considered in the closed state of the cover 20. The "the bottom part" refers to the part that covers the fixing means 61, 62 and 63 in the closed state of the cover 20. The locking part 70 is formed in the shown embodiment as two separate half-ring-like structures which are positioned such to each other that a locking counterpart 71, also formed as a half-ring-like structure and positioned at the non-cover part of the electricity meter 10. The locking counterpart 71 is therefore inserted between the two separate half-ring like structures in the closed state of the cover 20. The term "half-ring" refers to any mechanical arrangement that protrudes from a surface or other element and provides a bordered opening.

The locking counterpart 71 is comprised by the non-cover part of the electricity meter 10, especially by the housing of the electricity meter 10. Therefore, the cover locking part 70 and the locking counterpart 71 form together in the closed state a locking mechanism by creating a common opening by the half-ring-like structures through which a separate locking device, e.g. a wire, can be guided and lock the cover 20. The locking cover part 70 and the locking counterpart 71 do not need to have a half-ring-like structures, but can be built in other ways, however shall be built in such way that a locking mechanism is formed by cover locking part 70 and the locking counterpart 71, that is lockable in the closed state of the cover 20. This locking mechanism can require or not an additional locking device to lock the cover 20.

Figure 3:
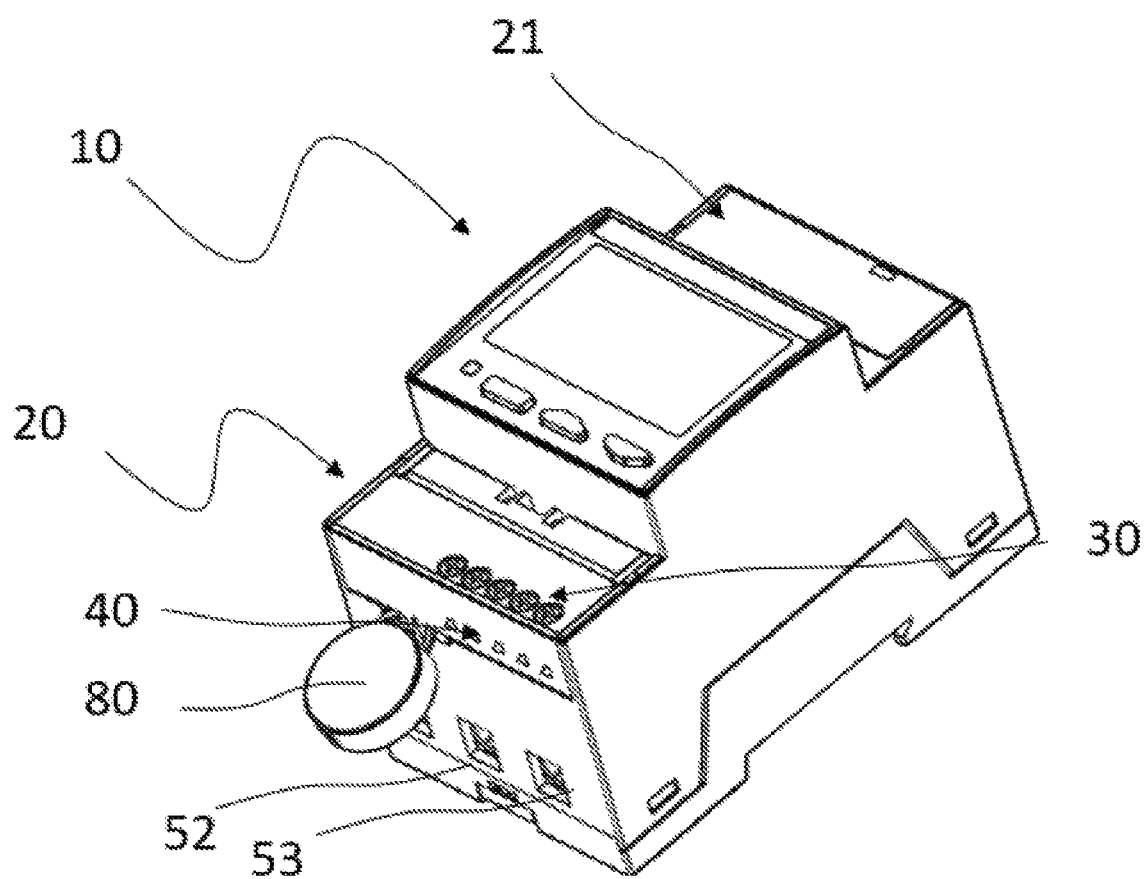
FIG. 3 shows a spatial view from an upper position of an embodiment of an electricity meter according to the present invention with a locked cover in a closed state.

FIG. 3 shows an electricity meter 10 also shown in FIG. 1 and FIG. 2 with a locked cover 20, whereas the cover 20 is in the closed state, the locking counterpart 71 and the cover locking part 70 are matched and a locking device 80 in form of a seal lock locks the half-ring structures of the cover locking part 70 and the locking counterpart 71 to each other.

Figure 4:
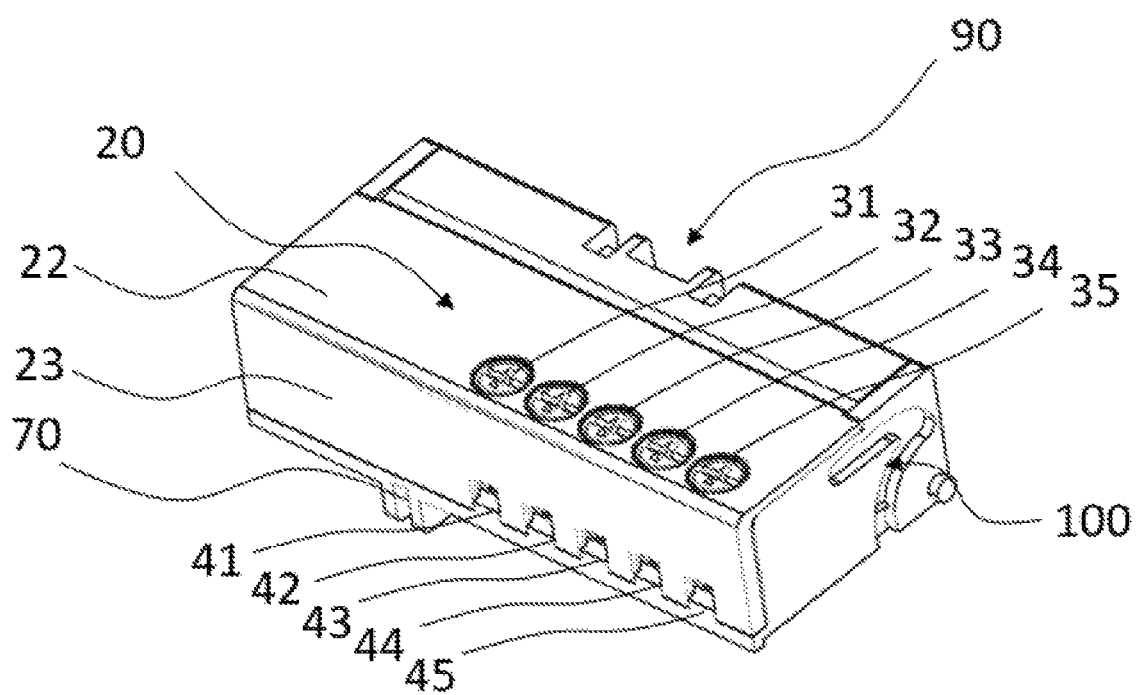
FIG. 4 shows spatial front view of an embodiment of a cover according to the present invention without electricity meter.
Figure 5:
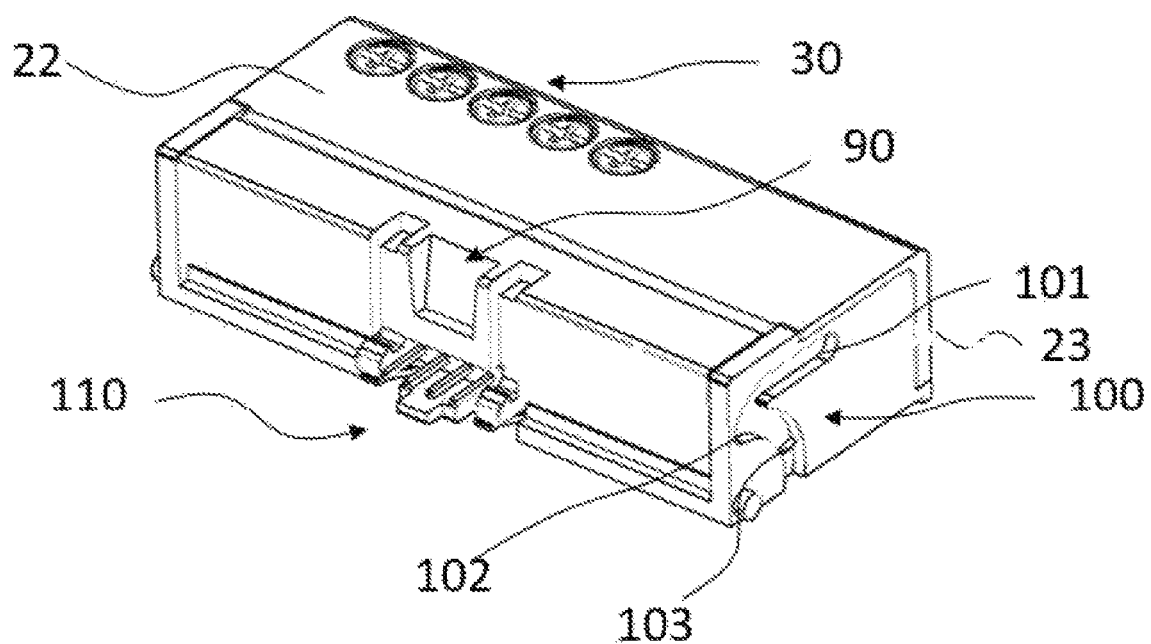
FIG. 5 shows spatial rear view of an embodiment of a cover according to the present invention without electricity meter.

FIG. 4 and FIG. 5 show a cover 20 in a state removed from the electricity meter 10 (see FIG. 1 to FIG. 3) from different directions. The box-like shaped cover 20 comprises in this embodiment five auxiliary ports 41 to 45 and five hole-screw mechanism as auxiliary fixing means 31 to 35 to fix an auxiliary line, cable or wire to the respective auxiliary port 41 to 45. Also, here the auxiliary fixing means 31 to 35 shall not be restricted to holes and screws and can be substituted in part or all by other fixing means. Also the number of auxiliary ports and auxiliary fixing means can be varied as required by the skilled person.

The cover 20 comprises at least one auxiliary port. The numbers auf auxiliary ports, i.e. two, three, four, five, six, seven or more may be adapted according to the requirements of the respective application. However, in a preferred embodiment all auxiliary ports 41, 42, 43, 44, 45 of an electricity meter are comprised by the cover 20. So no additional auxiliary ports and internal wiring is required for the electricity meter.

In FIG. 4 and FIG. 5 the V-like notch 100 is visible with which the cover 20 can be pivoted relative to the housing of the electricity meter from the open state into the closed state and vice versa. Such V-like notch 100 shall be advantageously present on both ending surfaces of the box-like cover 20, i.e. the surfaces perpendicular to the first and the second plane elements. These are the surface or side visible in FIG. 4 and FIG. 5 as well as on the opposite side to this side, to provide a stable guided movement of the cover 20.

The V-like notch 100 comprises a first flank 101, a rounded tip 102 and a second flank 103. The first flank 101 of the V-like notch 100 is oriented essentially parallel to the first plane element 22 of the cover 20, whereas the tip 102 of the notch 100 points in a direction opposite to the second plane element 23 of cover 20. The second flank 103 is not linear from the tip 102 to its ending portion, but shows a curvature into a direction away from the first flank 101. In its end portion, which runs to the side opposite to the first plane element 22 the flank is essentially perpendicular to the first plane element 22. So a hook is formed which shall be comprised by and considered as V-like notch 100.

FIG. 4 and FIG. 5 also indicate a removing mechanism 90 to reversibly remove the cover 20 from the electricity meter or to install the cover 20 to an electricity meter. Such removing mechanism 90 is according to the shown embodiment a sliding mechanism formed by elements of the cover 20 and the electricity meter. By interaction of these parts a mechanical fixing and unfixing of the cover on the electricity meter can be provided. So the cover 20 can be installed and uninstalled easily. Such requirement can be given, if a cover according to the prior art shall be removed and substituted by a cover 20 to enable further functions of the electricity meter, or a defect cover 20 shall be replaced by a working cover 20 or a cover 20 shall be substituted by a cover according to the prior art, i.e. a flap like cover without any active electrical parts, to reduce the functionality of an electricity meter for whatever reason.

For this purpose, also an electrical interface 110 is present which allows such reversible electric removal of the cover 20 from the electricity meter. The interface according to FIG. 4 and FIG. 5 comprises four contact pins on the cover side, which are electrically connected to the auxiliary ports 41, 42, 43, 44, 45. The electricity meter comprises the same number of holes to receive the contact pins and provide an electric connection from the auxiliary ports to the smart meter gateway via the electrical interface 110.

The electrical interface 110 can also be designed vice versa, i.e. the cover can comprise contact holes and the electricity meter can provide the corresponding contact pins. However, in terms of serviceability it is favorable to use contact pins on the cover-side because the cover can be more easily and cheaper replaced than the whole electricity meter, in case such contact pins are broken.

The interface can also use other suitable ways to reversibly connect and disconnect the electricity meter with the auxiliary ports. The interface shall not be restricted to pin-hole constructions.

Figure 6:
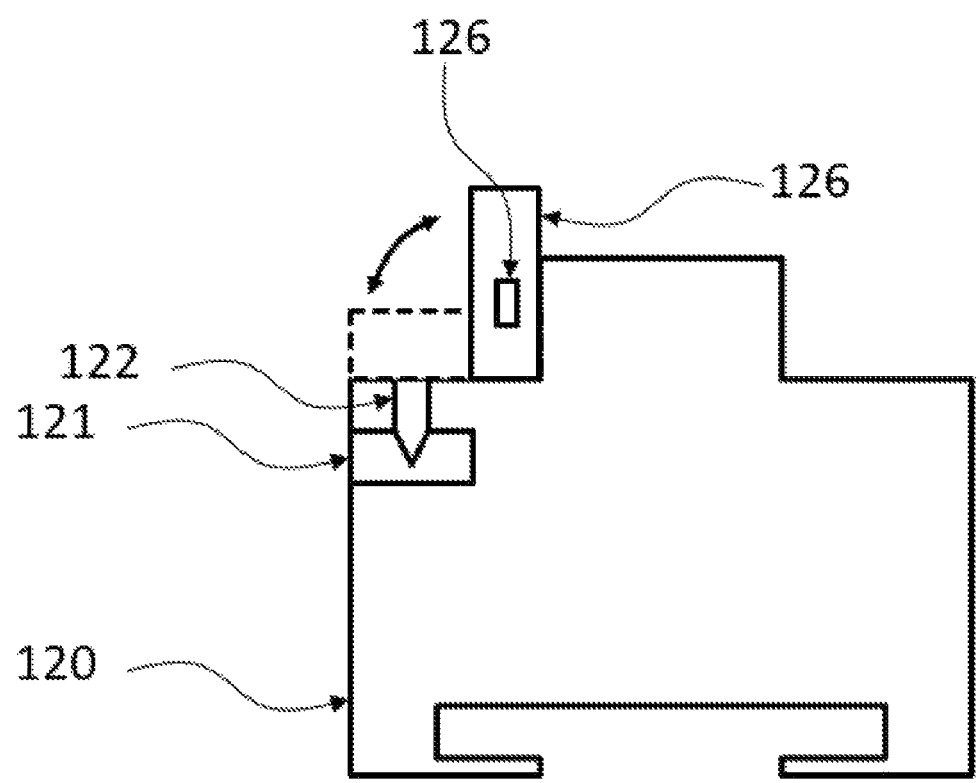
FIG. 6 shows an embodiment of an electrical rail mount device according to the present invention.

FIG. 6 shows an embodiment of an electrical rail mount device 120 from a side in a cross-cut view. The rail mount device 120 comprises an exemplary input terminal 121 and fixing means 122. A cover 125 is provided with the electrical rail mount device 120. The cover 125 comprises an electrical element 126. It is understood, that more than one input terminal may be provided with the electrical rail mount device 120 and that any other type of or number of electrical elements may also be provided.

The input terminal 121 may receive an input line 130 and the fixing means 122 may fix the input line 130. After fixing the input line 130, the cover 125 may be put in the closed position (indicated by dotted lines), where the cover 125 covers the fixing means 122. This means that the fixing means 122 are only accessible with the cover 125 in the open state. In addition, the cover 125 comprises an electrical element 126, here an exemplary WIFI controller that is internally in the electrical rail mount device 120 coupled to an active electronic element of the electrical rail mount device 120.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

The scope of the patents might also be directed to a cover for an electricity meter, comprising an auxiliary port and fixing means for connecting a connection to the auxiliary port, whereas the cover comprises a removal mechanism The present invention provides a cover 20 for an electricity meter 10 and an electricity meter 10 for measuring power consumption, comprising a power terminal 51, 52, 53 suitable to receive a power line, fixing means 61, 62, 63 with which the power line is fixable at the power terminal 51, 52, 53 to establish an electrical connection, a lockable cover 20 reversibly movable from an open state in a closed state, whereas in the closed state the cover 20 covers the fixing means 61, 62, 63 such that the fixing means can only be accessed by moving the cover 20 from the closed state into the open state, an auxiliary port 40, 41, 42, 43, 44, 45 to receive an auxiliary connection, whereas the auxiliary port 40, 41, 42, 43, 44, 4 is configured to allow a communication of an external source with a smart meter gateway comprised by the electricity meter 10, and auxiliary fixing means 30, 31, 32, 33, 34, 35 for fixing the auxiliary connection to the auxiliary port 40, 41, 42, 43, 44, 45 positioned such that they are accessible in the closed state of the cover. By providing a cover comprising the auxiliary port 40, 41, 42, 43, 44, 45 as well as the auxiliary fixing means 30, 31, 32, 33, 34, 35 a compact and structured electricity meter and a suitable cover for such electricity meter can be realized.

LIST OF REFERENCE SIGNS

10 Electricity meter
20 First Cover
21 Second Cover
30 Auxiliary fixing means
31 Fixing means for first auxiliary port
32 Fixing means for second auxiliary port
33 Fixing means for third auxiliary port
34 Fixing means for fourth auxiliary port
35 Fixing means for fifth auxiliary port
40 Auxiliary ports
41 First auxiliary port
42 Second auxiliary port
43 Third auxiliary port
44 Fourth auxiliary port
45 Fifth auxiliary port
51 First power terminal
52 Second power terminal
53 Third power terminal
61 Fixing means for first power terminal
62 Fixing means for second power terminal
63 Fixing means for third power terminal
70 Cover locking part
71 Locking counterpart
80 Separate lock
90 Removing mechanism
100 V-like notch
101 First flank
102 Tip
103 Second flank
110 Electrical Interface
120 electrical rail mount device
121 input terminal
122 fixing means
125 cover
126 electrical element While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electrical rail mount device for mounting on a rail, comprising:

at least one input terminal configured to receive an input line;

fixing means configured to fix the input line to the at least one input terminal to establish an electrical connection;

a lockable cover reversibly movable from an open state into a closed state, whereas the cover is configured to cover the fixing means in the closed state, such that the fixing means can only be accessed by moving the cover from the closed state into the open state; and an electrical element arranged in the cover and configured to provide an electrical function to an active electronic element of the electrical rail mount device, wherein an electrical connection is provided between the electrical element and the active electronic element, wherein the electrical rail mount device comprises an electricity meter for measuring power consumption, and wherein the at least one input terminal is provided as a power terminal configured to receive a power line as the input line, and the fixing means is configured to fix the power line to the power terminal to establish an electrical connection, and wherein the electrical element is provided as an auxiliary port configured to receive an auxiliary line, whereas the auxiliary port is configured to allow a communication of an external source with a smart meter gateway comprised by the electricity meter via the auxiliary line, the cover further comprising auxiliary fixing means for fixing the auxiliary line to the auxiliary port positioned such that they are accessible in the closed state of the cover, wherein the cover has a box shape, wherein the auxiliary port is arranged inside a volume defined by the box shaped cover.

2. The electrical rail mount device according to claim 1, wherein the cover is removably attached to the electricity meter.

3. The electrical rail mount device according to claim 2, wherein the auxiliary port is electrically connected to the smart meter gateway, whereas an electrical interface is present between the auxiliary port and the smart meter gateway, whereas the electrical interface connects an electrical contact connected with the auxiliary port with a contact connected to the smart meter gateway, whereas the electrical interface allows to reversibly electrically connect and disconnect the auxiliary port with the smart meter gateway.

4. The electrical rail mount device according to claim 1, wherein the cover comprises a plurality of auxiliary ports and corresponding auxiliary fixing means.

5. The electrical rail mount device according to claim 4, wherein the cover comprises a first plane element and a second plane element, whereas the first plane element and the second plane element are perpendicular to each other and are connected to each other at an edge of the first and second plane element, respectively, whereas the first plane element comprises inlets to receive auxiliary lines in the plurality of auxiliary ports and the second plane element is configured to provide access to the corresponding auxiliary fixing means.

6. The electrical rail mount device according to claim 5, wherein the cover is mounted pivotably to a housing of the electricity meter, to move the cover reversibly from the open state to the closed state and vice versa.

7. The electrical rail mount device according to claim 6, wherein the pivotably mounted cover is pivotable around a virtual axis parallel to the first plane element and the second plane element, whereas a position of the virtual axis is translationally moved during movement of the cover from the open state to the closed state.

8. The electrical rail mount device according to claim 7, further comprising guiding means in form of a notch at the cover and a pivot attached to a housing of the electricity meter, adjacent to said notch, whereas pivot gears into the notch and the pivot is slidable in the notch, whereas the pivot and the notch are interacting such that they define a pathway of the cover when moved from the closed state to open state and vice versa.

9. The electrical rail mount device according to claim 8, wherein the notch has V-like shape comprising a first flank and a second flank which are connected by a rounded tip whereas the notch is positioned in the closed state such that first flank of the V-like shape is parallel to the first plane element and the tip of the notch points away from the second plane element.

10. The electrical rail mount device according to claim 4, comprising a first cover for an input power terminal and a second cover for an output power terminal, whereas the auxiliary port and the auxiliary fixing means are comprised by only one of these covers.

11. The electrical rail mount device according to claim 1, wherein the cover comprises a locking cover part to lock the cover in the closed state by interaction of the locking cover part with a locking counterpart arranged at a housing of the electricity meter, whereas the locking cover part and the locking counterpart form together a locking mechanism.

12. The electrical rail mount device according to claim 10, wherein the locking cover part is lockable with the locking counterpart by a separate locking device.

13. A cover suitable to be installed at an electrical rail mount device to cover fixing means of the electrical rail mount device in a closed state, the cover comprising an electrical element configured to provide an electrical function to an active electronic element of the electrical rail mount device, wherein an electrical connection is provided between the electrical element and the active electronic element;
   wherein the electrical rail mount device comprises an electricity meter, and wherein the fixing means are configured for fixing a power line to a power terminal of the electricity meter and wherein the electrical element comprises an auxiliary port and wherein the cover comprises auxiliary fixing means for fixing an auxiliary line to the auxiliary port, whereas the auxiliary port is configured to allow a communication of an external source with a smart meter gateway comprised by the electricity meter via the auxiliary line, whereas the auxiliary port and the auxiliary fixing means are positioned such they are accessible when the cover is in the closed state; and
   further comprising a mechanism configured to reversibly mechanically install and uninstall the cover to and from the electricity meter and further comprising an electrical interface, whereas the electrical interface connects in the installed state the auxiliary line connected with the auxiliary port with a contact connectable to the electricity meter, whereas the electrical interface allows to reversibly electrically connect and disconnect the auxiliary port with the electricity meter.

* * * * *